(12) United States Patent  
Tsai et al.

(10) Patent No.: US 9,298,380 B1
(45) Date of Patent: *Mar. 29, 2016

(54) DATA STORAGE DEVICE WITH SELECTIVE WRITE TO A FIRST STORAGE MEDIA OR A SECOND STORAGE MEDIA

(71) Applicant: Western Digital Technologies, Inc., Irvine, CA (US)

(72) Inventors: Chun Sei Tsai, Tustin, CA (US); Choo-Bhin Ong, Foothill Ranch, CA (US); Carl E. Barlow, Lake Forest, CA (US); Cheng Fatt Yee, Subang Jaya (MY); Chandra M. Guda, Irvine, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/716,610

(22) Filed: May 19, 2015

Related U.S. Application Data

(63) Continuation of application No. 14/227,191, filed on Mar. 27, 2014, now Pat. No. 9,036,283.

(60) Provisional application No. 61/930,340, filed on Jan. 22, 2014.

(51) Int. Cl.
  *G06F 3/06* (2006.01)

(52) U.S. Cl.
  CPC .............. *G06F 3/0616* (2013.01); *G06F 3/068* (2013.01); *G06F 3/0619* (2013.01); *G06F 3/0653* (2013.01); *G06F 3/0659* (2013.01); *G06F 2003/0692* (2013.01)

(58) Field of Classification Search
  None
  See application file for complete search history.

(56) References Cited

U.S. PATENT DOCUMENTS

| | | | |
|---|---|---|---|
| 5,822,139 A * | 10/1998 | Ayabe | 360/31 |
| 6,249,890 B1 | 6/2001 | Ukani et al. | |
| 6,295,577 B1 | 9/2001 | Anderson et al. | |
| 7,304,816 B2 | 12/2007 | Johnson et al. | |
| 7,369,339 B2 | 5/2008 | Kojima et al. | |
| 7,373,559 B2 | 5/2008 | Guha | |
| 7,437,053 B2 * | 10/2008 | Ishibashi | 386/263 |
| 7,496,796 B2 | 2/2009 | Kubo et al. | |
| 8,037,348 B2 * | 10/2011 | Wei et al. | 714/6.3 |
| 8,817,412 B1 * | 8/2014 | Tomita et al. | 360/75 |
| 8,825,977 B1 | 9/2014 | Syu et al. | |
| 9,036,283 B1 | 5/2015 | Tsai et al. | |
| 2004/0051988 A1 | 3/2004 | Jing et al. | |
| 2006/0069870 A1 | 3/2006 | Nicholson et al. | |
| 2008/0130156 A1 | 6/2008 | Chu et al. | |
| 2013/0201809 A1 | 8/2013 | Hayashi | |

OTHER PUBLICATIONS

Sebastien A. Jean, et al., U.S. Appl. No. 13/297,163, filed Nov. 15, 2011, 39 pages.
Virgil V. Wilkins, et al., U.S. Appl. No. 13/157,111, filed Jun. 9, 2011, 8 pages.
Sebastien A. Jean, et al., U.S. Appl. No. 13/226,420, filed Sep. 6, 2011, 40 pages.
Notice of Allowance dated Jan. 21, 2015 from U.S. Appl. No. 14/227,191, 8 pages.

* cited by examiner

*Primary Examiner* — Paul Huber

(57) ABSTRACT

A device comprises a first storage media and a controller. The controller configured to generate a first operational metric using a first set of operational data at a first frequency and a second operational metric a second set of operational data at a second frequency different than the first frequency; receive a write command to write data to the first storage media; and divert the write command to write data to a second storage media instead of the first storage media when at least one of the first operational metric and the second operational metric indicates that writing data to the first storage media may be harmful to the magnetic rotating disk or result in data loss.

20 Claims, 7 Drawing Sheets

| First Set of Operational Data |
|---|
| Magneto-Resistive Resistance ("MRR") Data |
| Touch Down Sensor Resistance ("TDSR") Data |
| Variable Gain Amplitude ("VGA") Data |
| Bit Error Rate ("BER") Data |
| Head Media Separation ("HMS") Data |
| Error Margin ("EM") Data |
| Write Counts Data |
| Read Counts Data |
| Overwrite ("OW") Data |
| Resolution Data |
| Signal to Noise Ratio ("SNR") Data |

FIG. 2

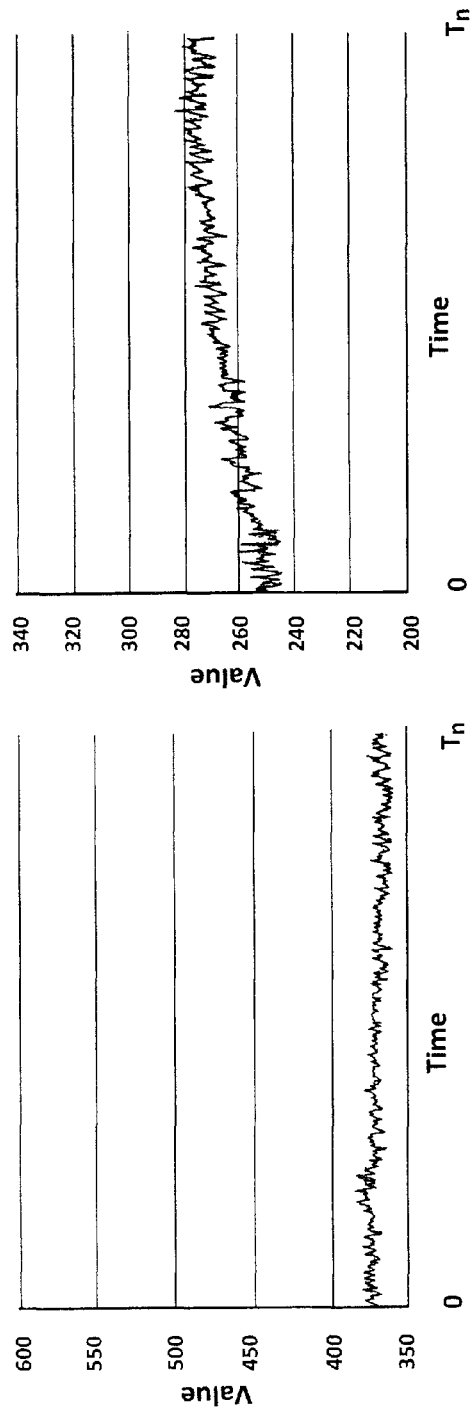

| Second Set of Operational Data |
|---|
| Temperature Data |
| Altitude Data |
| Vibration Data |
| Bits Transferred Data |

FIG. 5

DATA STORAGE DEVICE WITH SELECTIVE WRITE TO A FIRST STORAGE MEDIA OR A SECOND STORAGE MEDIA

CROSS-REFERENCE TO RELATED APPLICATIONS

This application is a continuation of U.S. application Ser. No. 14/227,191, filed on Mar. 27, 2014, entitled "DATA STORAGE DEVICE WITH SELECTIVE WRITE TO A FIRST STORAGE MEDIA OR A SECOND STORAGE MEDIA", which claims the benefit of U.S. Provisional Application No. 61/930,340, filed on Jan. 22, 2014, entitled "SELECTIVE WRITE TO A FIRST STORAGE MEDIA OR A SECOND STORAGE MEDIA", both of which are hereby incorporated by reference in their entirety.

BACKGROUND

A conventional data storage device may include a hard disk drive. The hard disk drive may include a disk. However, with the advent of higher and higher capacity, areal density is increased. In some instances, the head now has a lower fly height. The lower fly height can increase the chance of head disk interference, lube depletion, and pivot grease wear. Furthermore, high operating temperature may impact the writer and reader element of the head. In addition, constant usage of the hard disk drive may inevitably wear out the heads of the hard disk drive, leading to performance issues and data loss. Similarly, if the conventional data storage device includes a solid state memory, excessive workloads on the solid state drive can also lead to significant and premature wear due to detrimental write amplification.

BRIEF DESCRIPTION OF THE DRAWINGS

The features and advantages of the present embodiments will become more apparent from the detailed description set forth below when taken in conjunction with the drawings, wherein:

FIG. 2 depicts a first set of operational data according to an embodiment;

FIGS. 3A-3D depict operational data of a head according to an embodiment;

FIG. 5 depicts a second set of operational data according to an embodiment;

DETAILED DESCRIPTION

Figure 1:
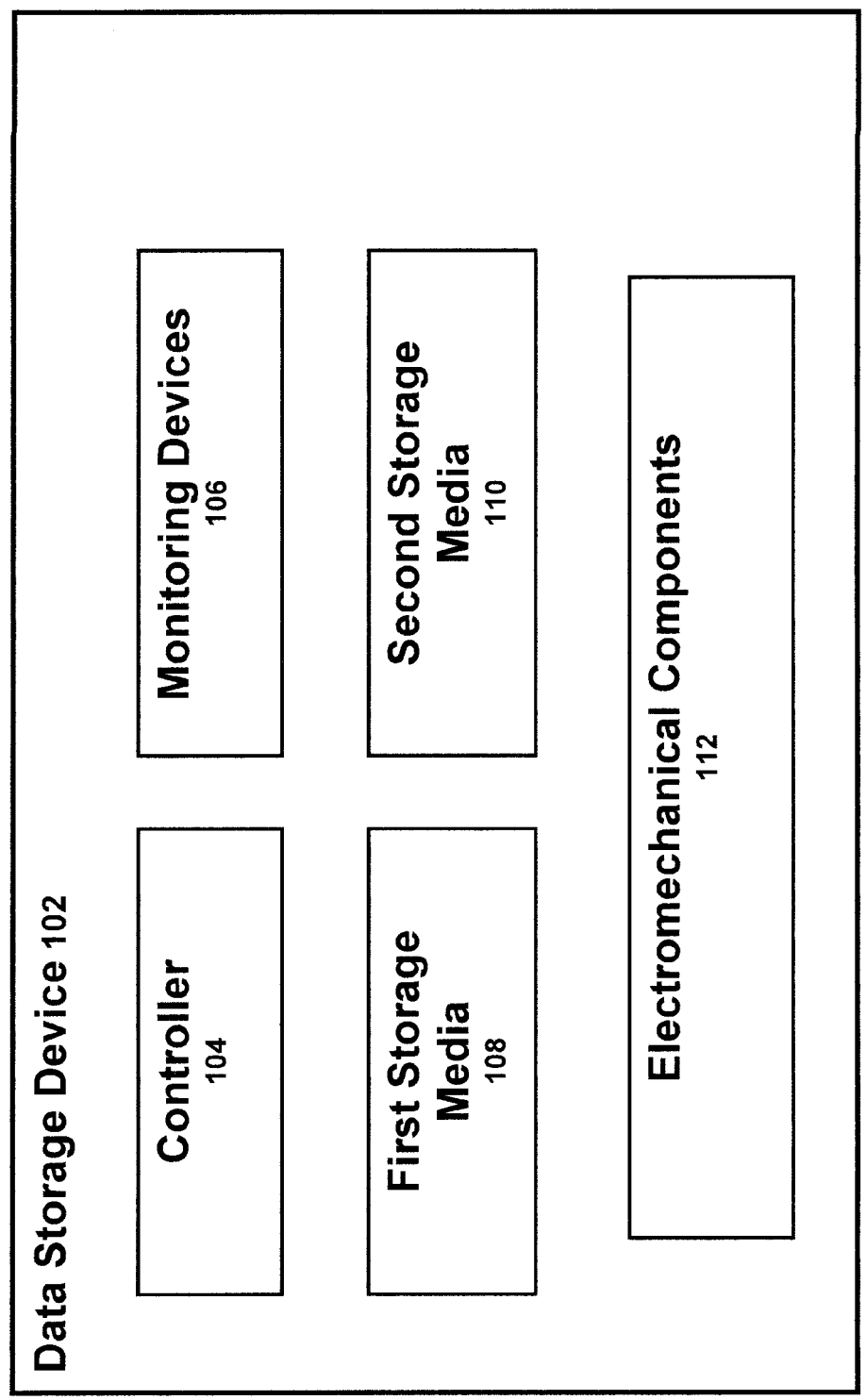
FIG. 1 depicts a data storage device according to an embodiment.

In an embodiment, a data storage device 102 is shown in FIG. 1. The data storage device 102 comprises, for example, a hybrid drive. In an embodiment, the data storage device 102 comprises a direct attached storage ("DAS") device, or a network attached storage ("NAS") device. The data storage device 102 can also be located within and be part of an electronic device, such as a laptop, a tablet, a mobile communications device, a set top box, or other device which may require data storage. In an embodiment, the data storage device 102 can be configured to be connected to a host. The data storage device 102 can be connected to the host utilizing a serial advanced technology attachment ("SATA") interface, a peripheral component interconnect express ("PCIe") interface, or other types of interface which may be suitable for transferring data or commands between the host and the data storage device 102.

As can be seen in the embodiment shown in FIG. 1, the data storage device 102 comprises a controller 104, monitoring devices 106, a first storage media 108, a second storage media 110, and electromechanical components 112.

The first storage media 108 can comprise a first access time, while the second storage media 110 can comprise a second access time less than the first access time. In an embodiment, the first storage media 108 comprises a magnetic rotating disk, while the second storage media 110 comprises a solid state memory.

While the description herein refers to solid state memory generally, it is understood that solid state memory may comprise one or more of various types of solid state non-volatile memory devices such as flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NAND memory (e.g., single-level cell (SLC) memory, multi-level cell (MLC) memory, or any combination thereof), NOR memory, EEPROM, Ferroelectric Memory (FeRAM), Magnetoresistive RAM (MRAM), other discrete NVM (non-volatile memory) chips, or any combination thereof.

In an embodiment, the electromechanical components 112 comprise components which may be utilized to operate the data storage device 102. For example, the electromechanical components 112 may comprise components which are utilized to read data from and write data to the first storage media 108, the second storage media 110, or any combination thereof. In an embodiment, the electromechanical components 112 may comprise a head stack assembly, a head gimbal assembly, and one or more heads utilized to read data from and write data to the first storage media 108.

In an embodiment, the monitoring devices 106 comprises one or more counters, temperature sensors, gyroscopes, vibration sensors, electromagnetic sensors, optical sensors, or other types of sensors which can detect electromechanical operation of the data storage device 102 or the environmental conditions of the data storage device 102. The monitoring devices 106 can be configured to generate a first set of operational data and a second set of operational data.

In an embodiment, the controller 104 is configured to generate a first operational metric from the first set of operational data and a second operational metric from the second set of operational data. In an embodiment, the first operational metric can indicate a change in the first set of operational data over time. Similarly, the second operational metric can indicate a change in the second set of operational data over time. Therefore, initial values of the first set of operational data, the second set of operational data, the first operational metric, and the second operational metric may be recorded after manufacturing, but prior to shipping of the data storage device 102. In an embodiment, this may provide baseline data for future comparisons.

The controller 104 can also be configured to generate a combined operational metric using the first operational metric, the second operational metric, the first set of operational data, the second set of operational data, or any combination thereof.

In an embodiment, the first set of operational data comprises the electromechanical operation data of the data storage device 102. For example, as shown in an embodiment in FIG. 2, the first set of operational data can comprise one or more of magneto-resistive resistance ("MRR") data, touch down sensor resistance ("TDSR") data, magneto-resistive asymmetry ("MRA") data, variable gain amplitude ("VGA") data, bit error rate ("BER") data, head media separation ("HMS") data, error margin ("EM") data, write counts data, read counts data, overwrite ("OW") data, resolution data, or signal to noise ratio ("SNR") data. In an embodiment, the first set of operational data can also comprise a touch down ("TD") count data.

In an embodiment, the MRR data indicates a magnetic resistance of the head, the TDSR data indicates where the head contacts the first storage media 108, the MRA data indicates whether the head is symmetrical or asymmetrical, the VGA data indicates an amplitude of the head, the BER data indicates the error information for the head, and the HMS data indicates a fly height of the head. In an embodiment, the EM data indicates how close the head is to a wall or cliff, the write counts data indicates an amount of writes that has been performed by the head, the read counts data indicates an amount of reads that has been performed by the head, and overwrite data indicates how well the head overwrites old data. In an embodiment, the resolution data indicates a ratio of amplitude at a high or highest frequency to amplitude at a low or lowest frequency, the SNR data indicates a signal to noise ratio for the head. In an embodiment, the TD count data can indicate instances of thermal asperity. The increasing presence of such thermal asperities may be an indication of deteriorating health of the media and possibly an increased risk of head-media contact while reading or writing to that media.

In an embodiment, the operational data can comprise data for one or more heads used to read data from and write data to the first storage media 108. In an embodiment, the first set of operational data can provide a health indication of the first storage media 108. The first operational metric can be, for example, a health metric of the first storage media 108. In some embodiments, these operational data can reflect the health of a head of the first storage media 108.

In an embodiment, FIGS. 3A, 3B, 3C, and 3D are graphs charting example operational data as observed over time (the X axis) for a head. In an embodiment, FIG. 3A depicts MRR data, FIG. 3B depicts write count data, FIG. 3C depicts VGA data, and FIG. 3D depicts BER data. In a healthy head, it can be seen that the example operational data (MRR data, write count data, VGA data, and BER data) are all working with very little change over time.

Figure 4B:
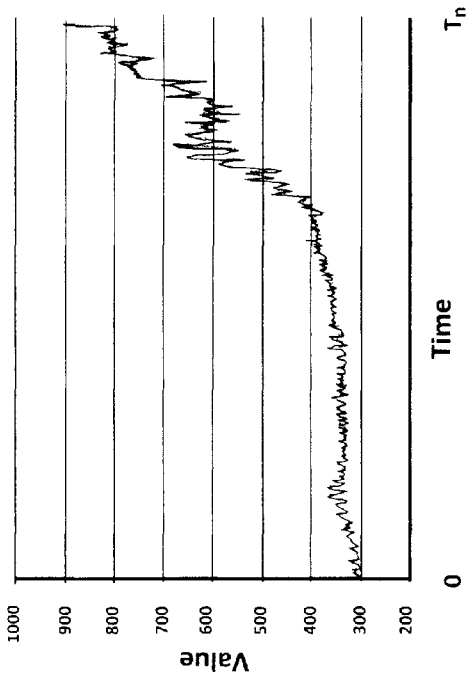
FIGS. 4A-4D depict operational data of a head according to an embodiment.
Figure 4D:
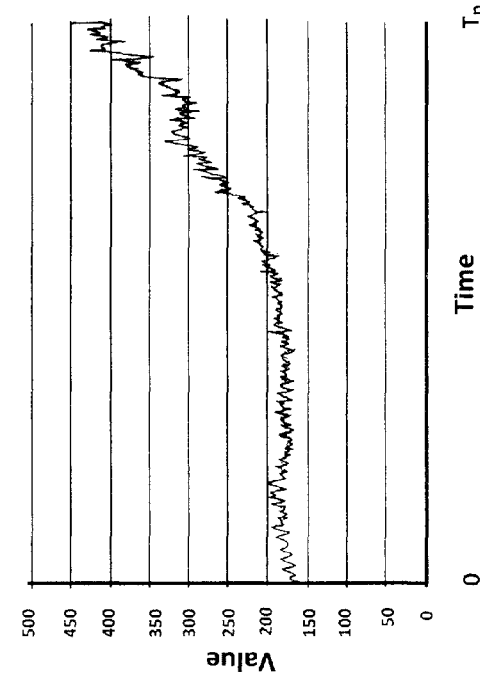
Figure 4A:
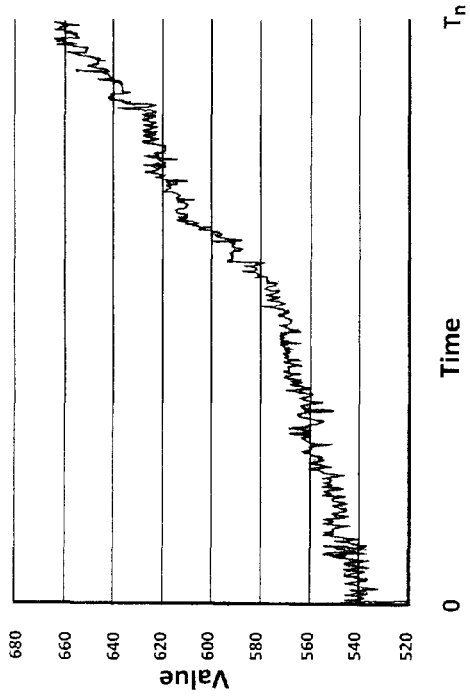
Figure 4C:
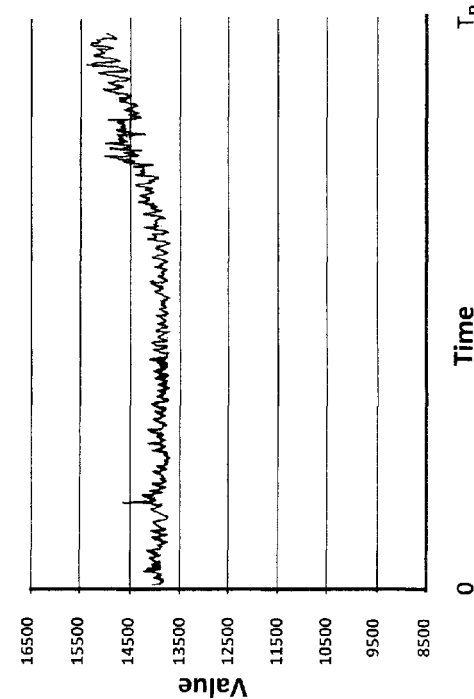

In an embodiment FIGS. 4A, 4B, 4C, and 4D are graphs charting example operational data as observed over time (the X axis) for the head when it is not healthy. In an embodiment, FIG. 4A depicts MRR data, FIG. 4B depicts write count data, FIG. 4C depicts VGA data, and FIG. 4D depicts BER data. In an unhealthy head, it can be seen that the example operational data (MRR data, write count data, VGA data, and BER data) has drastically increased over time. Thus, in one embodiment, with the change, and/or the rate of change, a prediction algorithm can be devised to estimate the likelihood of an impending failure and used as a basis to trigger corrective action(s).

In an embodiment, the second set of operational data comprises environmental data for the first storage media 108 or the data storage device 102. For example as shown in an embodiment in FIG. 5, the second set of operational data can comprise one or more of temperature data, altitude data, vibration data, or bits transferred data. Thus, in an embodiment, the second set of operational data can comprise environmental conditions of the first storage media 108. In an embodiment, the second set of operational data can additionally comprise a detected instance of thermal asperity (e.g., from a touch down sensor) in an area within the address range(s) of data access command(s) to be executed.

In an embodiment, the first operational metric can be updated at a first frequency while the second operational metric can be updated at a second frequency greater than the first frequency. For example, the first operational metric may be updated once every few days, while the second operational metric may be updated several times a minute. However, the first operational metric and the second operational metric may be updated at alternative intervals.

Figure 6:
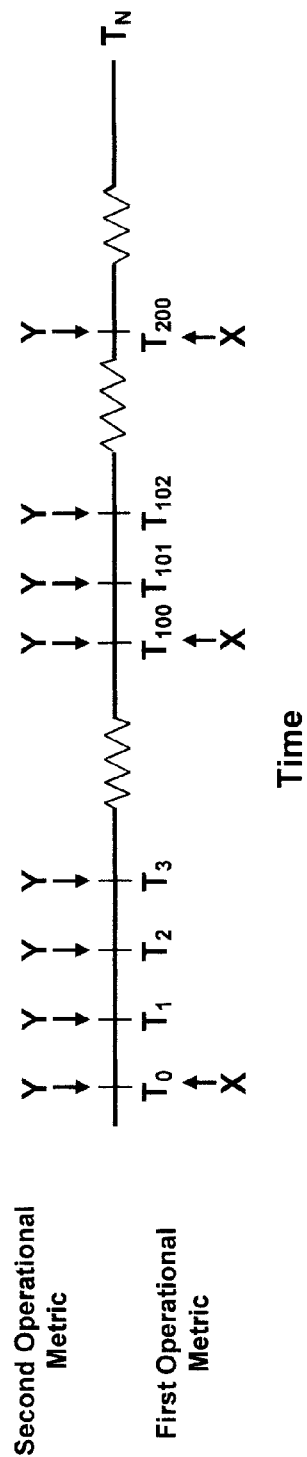
FIG. 6 depicts a first set of operational metric and a second set of operational metric according to an embodiment.
Figure 7:
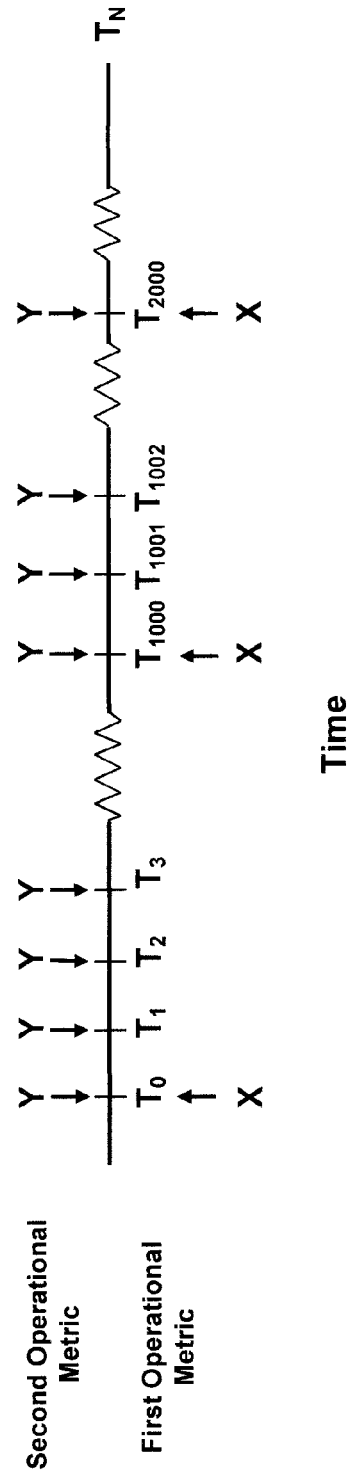
FIG. 7 depicts a first set of operational metric and a second set of operational metric according to an embodiment.

This can be seen, for example, in the embodiments shown in FIGS. 6 and 7. In the embodiment shown in FIG. 6, the second operational metric is updated at an interval, such as, $T_0$, $T_1$, $T_2$, $T_3$, etc. This is shown by the "Y" indications. However, the first operational metric is updated at every hundred intervals such as $T_0$, $T_{100}$, $T_{200}$, etc. This is shown by the "X" indications. In the embodiment shown in FIG. 7, the first operational metric can be updated at greater intervals. For example, the first operational metric is updated at every thousand intervals such as $T_0$, $T_{1000}$, $T_{2000}$, etc. The embodiments shown in FIGS. 6 and 7 are merely exemplary and as previously noted the first operational metric and the second operational metric may be updated at alternative intervals.

In an embodiment, the combined operational metric may be updated at a third frequency. In an embodiment, the third frequency may be substantially similar to the second frequency.

While the first operational metric may be updated at the first frequency, the data in the first set of operational data need not be updated at the first frequency. Instead, the data in the first set of operational data may be updated at a greater frequency. Similarly, the second set of operational data may be updated at a different frequency than the second frequency. In an embodiment, the second set of operational data may be updated at a greater frequency than the second frequency.

Figure 8:
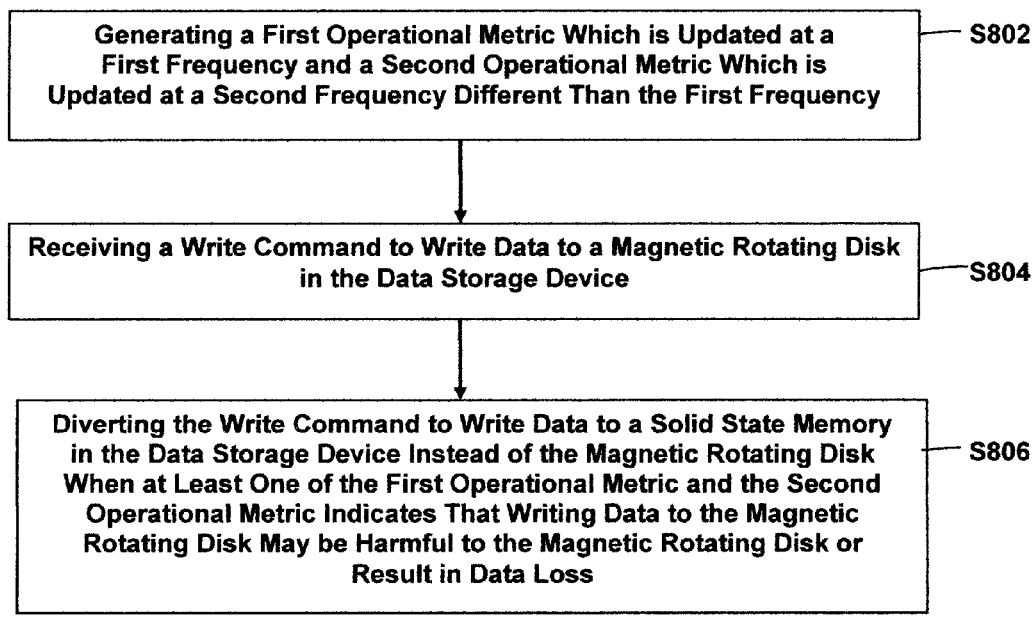
FIG. 8 depicts a process for writing data in a data storage device.

In an embodiment, the controller 104 is configured to read data from and write data to the first storage media 108 and the second storage media 110. In an embodiment, the controller 104 is configured to divert writes from the first storage media 108 to the second storage media 110. This can be seen, for example, in a process for writing data in the data storage device 102 as shown in an embodiment in FIG. 8.

In block S802, the controller 104 generates the first operational metric which is updated at the first frequency and the second operational metric which is updated at the second frequency different than the first frequency. In block S804, the controller 104 receives a write command to write data. In an embodiment, the controller 104 can receive the write command from the host connected to the data storage device 102. The write command can comprise, for example, a write command to write the data to the first storage media 108.

In block S806, the controller 104 diverts the write command to write data to the second storage media 110 instead of the first storage media 108 when at least one of the first operational metric and the second operational metric indicates that writing data to the first storage media 108 may be harmful to the first storage media 108 or result in data loss. For example, the controller 104 can analyze the first operational metric, the second operational metric, the combined operational metric, or any combination thereof, and divert the write command to the second storage media 110 instead. Thus, the controller 104 can write the data to the second storage media 110 instead of the first storage media 108.

In an embodiment the controller 104 can divert the write command from the first storage media 108 to the second storage media 110 when the combined operational metric or any data used to generate the combined operational metric (e.g., first operational data, second operational data, first operational metric, or second operational metric) indicates that the longevity of the first storage media 108 may be increased by diverting the write command from the first storage media 108 to the second storage media 110. For example, if there is a large amount of vibration, writing data to the first storage media 108 may be hazardous to the first storage media 108 due to the increased likelihood of the head of the data storage device 102 being in an incorrect position or worse striking the first storage media 108. This can cause data loss or even physical damage to the first storage media 108.

In an embodiment, the controller 104 can divert the write command from the first storage media 108 to the second storage media 110 when the combined operational metric or any data used to generate the combined operational metric indicates that writing data to the first storage media 108 may be harmful to the first storage media 108 and/or result in data loss.

In an embodiment, the controller 104 can divert the write command from the first storage media 108 to the second storage media 110 when the combined operational metric is less than a predetermined combined operational metric threshold. The predetermined combined operational metric threshold may indicate when writing data to the first storage media 108 may be harmful to the first storage media 108, may reduce longevity of the first storage media 108, or may result in data loss.

In an embodiment, the controller 104 can generate a combined operational metric for each of the heads in the data storage device 102. Thus, the controller 104 can divert the write command from the first storage media 108 to the second storage media 110 on a head by head basis. That is, if data storage device 102 would utilize a first head to write data to the first storage media 108, the controller 104 would utilize the combined operational metric corresponding to the first head to determine whether to divert the write command to the second storage media 110 or not. However, if the data storage device 102 would utilize a second head to write data to the first storage media 108, the controller 104 would utilize the combined operational metric corresponding to the second head to determine whether to divert the write command to the second storage media 110 or not. In addition, the controller 104 can also divert the write command based not only on the combined operational metric, but an individual operational metric of a head, such as the first operational metric or the second operational metric for the head.

For example, a first head may have first operational metric (e.g., steady trends on MRR, VGA, etc.) that indicates good health and a second head may have first operational metric (e.g., increasing trends on MRR, VGA, etc.) that indicates deteriorating health. Both heads would likely have the same second operational metric (e.g., both will experience the same temperature). However, in this example, a write to the first head may be allowed to execute while a write to the second head may be diverted due to the second head's first operational metric. This allows the health based diversion to be executed at a fine granular level, rather than the magnetic media as a whole, which serves to reduce the number of writes to the solid state media, extending the life of that media. As an additional example, the second operational metric (temperature, altitude, vibration, etc.) may indicate a highly unfavorable environment. Rather than diverting all writes intended for the magnetic media to the solid state media, writes to heads in better health (as indicated by the first operational metric) may be allowed.

In an embodiment, the controller 104 can also utilize the first operational metric, the second operational metric, the first set of operational data, the second set of operational data, or any combination thereof to determine whether to divert the write command to the storage media 110 or not. Furthermore, the use of the additional data or metrics listed above can be in addition or instead of the combined operational metric.

In an embodiment, the controller 104 can migrate data which was diverted to the second storage media 110 back to the first storage media 108 when the combined operational metric, the first operational metric, the second operational metric, the first set of operational data, the second set of operational data, or any combination thereof indicates that writing data to the first storage media 108 has a reduced likelihood of being harmful to the first storage media 108 or resulting in data loss, or is otherwise acceptable. In an embodiment, the controller 104 can write a copy of the data which was diverted to the second storage media 110 back to the first storage media 108 when the combined operational metric, the first operational metric, the second operational metric, the first set of operational data, the second set of operational data, or any combination thereof indicates that writing data to the first storage media 108 has a reduced likelihood of being harmful to the first storage media 108 or resulting in data loss, or is otherwise acceptable.

In addition, the controller 104 can write a copy of the data which was diverted to the second storage media 110 back to the first storage media 108 when the second storage media 110 may be potentially unreliable, such as when the second storage media 110 exceeds a write count threshold. The write count threshold can indicate, for example, that the second storage media 110 is beyond its expected life cycle. In such a case, the writing of the copy of the data which was diverted to the second storage media 110 back to the first storage media 108 can occur when the combined operational metric, the first operational metric, the second operational metric, the first set of operational data, the second set of operational data, or any combination thereof indicates that writing data to the first storage media 108 has a reduced likelihood of being harmful to the first storage media 108 or resulting in data loss, or is otherwise acceptable.

In an embodiment, the controller 104 can migrate data which was diverted to the second storage media 110 back to the first storage media 108 when the combined operational metric, the first operational metric, the second operational metric, the first set of operational data, the second set of operational data, or any combination thereof indicates that writing data to the first storage media 108 indicates that writing data to the first storage media 108 has a reduced likelihood of being harmful to the first storage media 108 or resulting in data loss, is otherwise acceptable, and/or when the second storage media 110 is substantially full.

Such migration of data need not occur instantaneously or substantially instantaneously. Instead, the migration of data can occur during down times of the data storage device 102, such as between write or read commands, or other opportune times to reduce performance impact to the data storage device 102.

Furthermore, in an embodiment, the controller 104 can also receive a write command to write data to the second storage media 110. In such a case, the controller 104 can also divert the write command to write data to the first storage media 108 instead of the second storage media 110. In such a case, the controller 104 can also generate a third set of operational data. The third set of operational data may comprise write rate data to the second storage media 110, thermal decay data, and/or other data which may indicate writing data to the second storage media 110 may be harmful to the second storage media 110, impact the longevity of the second storage media 110 or result in data loss. The write rate data can include, for example, the rate at which data is being written to the second storage media 110. The write rate data can also include, for example, an amount of data that is being written to the second storage media 110. The thermal decay data can indicate, for example, data loss over time due to thermal events. The thermal events can comprise heat.

Thus, in an embodiment, the controller 104 can divert the write command to write data to the first storage media 108 instead of the second storage media 110 when the third set of operational data indicates that writing data to the second storage media 110 may be harmful to the second storage media 110, writing data to the second storage media 110 may result in data loss, or writing data to the first storage media 108 instead of the second storage media 110 may prolong the longevity of the second storage media 110.

In an embodiment, the second storage media 110 may be worn out due to excessive writes as indicated by the write rate data or thermal decay data. Thus, the controller 104 need not divert all write commands to write data to the first storage media 108 instead of the second storage media 110. Instead, the controller 104 may divert only some of the write commands to write data to the first storage media 108 instead of the second storage media 110. In an embodiment, this can reduce the amount of times that data is written to the second storage media 110 while also reducing performance impact due to the diversion of data to first storage media 108, which has a longer access time than the second storage media 110.

Those of ordinary skill would appreciate that the various illustrative logical blocks, modules, and algorithm parts described in connection with the examples disclosed herein may be implemented as electronic hardware, computer software, or combinations of both. Furthermore, the embodiments can also be embodied on a non-transitory machine readable medium causing a processor or computer to perform or execute certain functions.

To clearly illustrate this interchangeability of hardware and software, various illustrative components, blocks, modules, circuits, and process parts have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosed apparatus and methods.

The parts of a method or algorithm described in connection with the examples disclosed herein may be embodied directly in hardware, in a software module executed by a processor, or in a combination of the two. The parts of the method or algorithm may also be performed in an alternate order from those provided in the examples. A software module may reside in RAM memory, flash memory, ROM memory, EPROM memory, EEPROM memory, registers, hard disk, a removable disk, an optical disk, or any other form of storage medium known in the art. An exemplary storage medium is coupled to the processor such that the processor can read information from, and write information to, the storage medium. In the alternative, the storage medium may be integral to the processor. The processor and the storage medium may reside in an Application Specific Integrated Circuit (ASIC).

The previous description of the disclosed examples is provided to enable any person of ordinary skill in the art to make or use the disclosed methods and apparatus. Various modifications to these examples will be readily apparent to those skilled in the art, and the principles defined herein may be applied to other examples without departing from the spirit or scope of the disclosed method and apparatus. The described embodiments are to be considered in all respects only as illustrative and not restrictive and the scope of the disclosure is, therefore, indicated by the appended claims rather than by the foregoing description. All changes which come within the meaning and range of equivalency of the claims are to be embraced within their scope.

What is claimed is:

1. A device comprising:
   a first storage media; and
   a controller configured to:
   generate a first operational metric which is updated at a first frequency and a second operational metric which is updated at a second frequency different than the first frequency;
   receive a write command to write data to the first storage media; and
   divert the write command to write data away from the first storage media when a combined metric, generated based on the first operational metric and the second operational metric exceeds a threshold related to a risk of harm to the first storage media or data loss.

2. The device of claim 1 wherein the first operational metric is generated using a first set of operational data comprising electromechanical operation data of the device.

3. The device of claim 1 wherein the first storage media further comprises a head configured to write data to the first storage media, and wherein the first operational metric is generated using a first set of operational data corresponding to a health of the head.

4. The device of claim 3 wherein the first operational metric is generated using a first set of operational data comprising at least one of magneto-resistive resistance ("MRR") data, touch down sensor resistance ("TDSR") data, magneto-resistive asymmetry ("MRA") data, variable gain amplitude ("VGA") data, bit error rate ("BER") data, head media separation ("HMS") data, error margin ("EM") data, write counts data, read counts data, overwrite ("OW") data, resolution data, and signal to noise ratio ("SNR") data.

5. The device of claim 1 wherein the first operational metric comprises a rate of change of data within a first set of operational data.

6. The device of claim 1 wherein the second operational metric is generated using a second set of operational data comprising environmental data for the device or the first storage media.

7. The device of claim 1 wherein the second operational metric is generated using a second set of operational data comprising at least one of temperature data, altitude data, vibration data, and bits transferred data.

8. The device of claim 1 wherein the second operational metric is generated using a second set of operational data comprising an indication related to whether a detected instance of thermal asperity is in an area within an address range associated with the write command.

9. The device of claim 1 wherein the second operational metric comprises a rate of change of data within a second set of operational data.

10. The device of claim 1 further comprising a plurality of heads, wherein the controller is further configured to divert the write command by:
- determining a head of the plurality of heads to be used to write the write data; and
- diverting the write command to write data away the first storage media based on an operational metric of the head, wherein the operational metric of the head comprises at least part of at least one of the first operational metric and the second operational metric.

11. A method for writing data in a device comprising:
- generating a first operational metric which is updated at a first frequency and a second operational metric which is updated at a second frequency different than the first frequency;
- receiving a write command to write data to a first storage media in the device; and
- diverting the write command to write data away from the first storage media when a combined metric, generated based on the first operational metric and the second operational metric, exceeds a threshold related to a risk of harm to the first storage media or data loss.

12. The method of claim 11 wherein the first operational metric is generated using a first set of operational data comprising electromechanical operation data of the device.

13. The method of claim 11 wherein the first storage media further comprises a head configured to write data to the first storage media, and wherein the first operational metric is generated using a first set of operational data corresponding to a health of the head.

14. The method of claim 13 wherein the first operational metric is generated using a first set of operational data comprising at least one of magneto-resistive resistance ("MRR") data, touch down sensor resistance ("TDSR") data, magneto-resistive asymmetry ("MRA") data, variable gain amplitude ("VGA") data, bit error rate ("BER") data, head media separation ("HMS") data, error margin ("EM") data, write counts data, read counts data, overwrite ("OW") data, resolution data, and signal to noise ratio ("SNR") data.

15. The method of claim 11 wherein the first operational metric comprises a rate of change of data within a first set of operational data.

16. The method of claim 11 wherein the second operational metric is generated using a second set of operational data comprising environmental data for the device or the first storage media.

17. The method of claim 11 wherein the second operational metric is generated using a second set of operational data comprising at least one of temperature data, altitude data, vibration data, and bits transferred data.

18. The method of claim 11 wherein the second operational metric is generated using a second set of operational data comprising an indication related to whether a detected instance of thermal asperity is in an area within an address range associated with the write command.

19. The method of claim 11 wherein the second operational metric comprises a rate of change of data within a second set of operational data.

20. The method of claim 11 wherein the device further comprises a plurality of heads, wherein diverting the write command further comprises:
- determining a head of the plurality of heads to be used to write the write data; and
- diverting the write command to write data away from the first storage media based on an operational metric of the head, wherein the operational metric of the head comprises at least part of at least one of the first operational metric and the second operational metric.

* * * * *